United States Patent
Kim et al.

(10) Patent No.: US 7,303,966 B2
(45) Date of Patent: Dec. 4, 2007

(54) SEMICONDUCTOR DEVICE AND METHOD OF MANUFACTURING THE SAME

(75) Inventors: Sang Hun Kim, Daejeon (KR); Hyun Cheol Bae, Daejeon (KR); Sang Heung Lee, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 11/485,895

(22) Filed: Jul. 13, 2006

(65) Prior Publication Data
US 2007/0134879 A1    Jun. 14, 2007

(30) Foreign Application Priority Data
Dec. 9, 2005    (KR) .................... 10-2005-0120414

(51) Int. Cl.
*H01L 21/336* (2006.01)
(52) U.S. Cl. ...................................... 438/300; 438/269
(58) Field of Classification Search ................ 438/269, 438/300
See application file for complete search history.

(56) References Cited

U.S. PATENT DOCUMENTS
6,281,062 B1    8/2001    Sanchez
(Continued)

FOREIGN PATENT DOCUMENTS
KR    97-470    4/1995

OTHER PUBLICATIONS

'35% Drive Current Improvement from Recessed-SiGe Drain Extensions on 37 nm Gate Length PMOS' Chidambaram et al., 2004 Symposium on VLSI Technology Digest of Technical Papers, pp. 48-49.
'Lattice strain analysis of transistor structures with silicon-germanium and silicon-carbon source/drain stressors' Ang et al., Applied Physics Letters 86, 093102, 2005 American Institute of Physics.
(Continued)

*Primary Examiner*—Jack Chen
(74) *Attorney, Agent, or Firm*—Ladas & Parry LLP (57) ABSTRACT

Provided are a semiconductor device and a method of manufacturing the same. The method includes the steps of: forming a first silicon layer on a semiconductor substrate; patterning the first silicon layer formed on the semiconductor substrate, and exposing a channel region; forming a second silicon layer on the semiconductor substrate in which the channel region is exposed; removing the first silicon layer, and forming source and drain regions; and forming a third silicon layer in the source and drain regions. According to the manufacturing method, it is possible to minimize defects in a silicon interface by forming the source and drain using only a selective epitaxial growth method without a dry-etching process. Also, since stress is concentrated to a silicon channel region, hole mobility and driving current characteristics are considerably improved.

12 Claims, 6 Drawing Sheets

U.S. PATENT DOCUMENTS

| | | |
|---|---|---|
| 6,707,062 B2 | 3/2004 | Lee |
| 6,762,463 B2 | 7/2004 | Kim |
| 6,872,625 B2 | 3/2005 | Schmidt et al. |
| 6,887,762 B1 | 5/2005 | Murthy et al. |
| 6,937,516 B2 | 8/2005 | Fazan et al. |
| 6,946,350 B2 | 9/2005 | Lindert et al. |
| 7,211,491 B2 * | 5/2007 | Cho .......................... 438/305 |
| 7,211,871 B2 * | 5/2007 | Cho .......................... 257/408 |

OTHER PUBLICATIONS

'A Systematic Study of Trade-offs in Engineering a Locally Strained pMOSFET' Nouri et al., Applied Materials, Sunnydale, CA 2004. IEEE.

'A 90nm High Volume Manufacturing Logic Technology Featuring Novel 45nm Gate Length Strained Silicon CMOS Transistors' Ghani et al., Portland Technology Development, Hillsboro, OR, 2003.

\* cited by examiner

SEMICONDUCTOR DEVICE AND METHOD OF MANUFACTURING THE SAME

CROSS-REFERENCE TO RELATED APPLICATION

This application claims priority to and the benefit of Korean Patent Application No. 2005-120414, filed Dec. 9, 2006, the disclosure of which is incorporated herein by reference in its entirety.

BACKGROUND

1. Field of the Invention

The present invention relates to a semiconductor device and a method of manufacturing the same, and more particularly, to a semiconductor device having a recessed source and drain structure formed by selective epitaxial growth of a compound semiconductor material such as silicon-germanium (SiGe) and a method of manufacturing the same.

2. Discussion of Related Art

Recently, as electrical devices are being made ever smaller, thinner and lighter, semiconductor devices are rapidly being made smaller and thinner. For example, reduction in the size of complementary metal-oxide semiconductor (CMOS) transistors has led to considerable progress in increasing the operating speed and degree of integration of devices. However, a CMOS transistor having a gate width of 65 nm or less is hard to manufacture because various problems may occur in the manufacturing process. In order to solve the problems, various methods of applying tension and compressive stress to a silicon channel constituting a transistor to enhance electron and hole mobility and increase driving current have been suggested.

According to one of the methods, a SiGe layer in which stress is reduced is grown to have minimum defects under both sides of a silicon channel. It is known that the electron mobility of an outwardly strained silicon channel formed on a SiGe single crystal is higher than that of a bulk silicon layer. In addition, it is known that the hole mobility of a compressively strained SiGe layer having a high germanium content is five or more times faster than that of a bulk silicon layer.

According to another method, after a transistor has been manufactured, a silicon-nitride layer having high stress is grown on the transistor, and thereby stress is applied to a silicon channel. It is known that electron mobility increases by about 20% when the method is applied to an n-type metal-oxide semiconductor field effect transistor (nMOSFET). Most lately, a method that forms a recessed SiGe source and drain in a p-type MOSFET (pMOSFET) and thereby improves hole mobility has been suggested. It is known that hole mobility increases by about 50% and driving current increases by about 25% when the method is applied.

According to the most general method of forming a recessed SiGe source and drain, a gate spacer is formed, a substrate is etched to a desired depth by a plasma dry-etching method, and a SiGe layer is selectively formed in source and drain regions by a chemical vapor deposition method.

Hereinafter, a conventional recessed source and drain structure will be described with reference to appended drawings. FIGS. 1A to 1D are side cross-sectional views illustrating a manufacturing process of a semiconductor device having a conventional recessed source and drain structure.

Figure 1A:
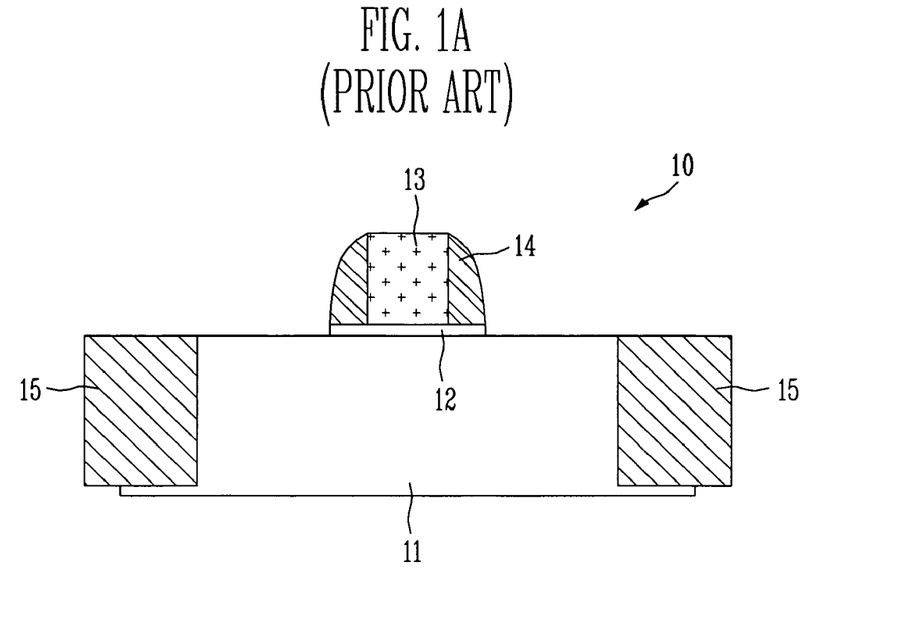
FIGS. 1A to 1D are cross-sectional views illustrating a method of manufacturing a semiconductor device having conventional recessed silicon-germanium (SiGe) source and drain.

Referring to FIG. 1A, a gate oxide layer 12 is formed on a semiconductor substrate 11 which constitutes a transistor 10, and a gate electrode 13 is formed on the gate oxide layer 12. Gate spacers 14 are formed on sidewalls of the gate electrode 13, and isolation layers 15 are formed at outer regions surrounding an element in order to isolate the element from adjacent elements, e.g., transistors.

Figure 1B:
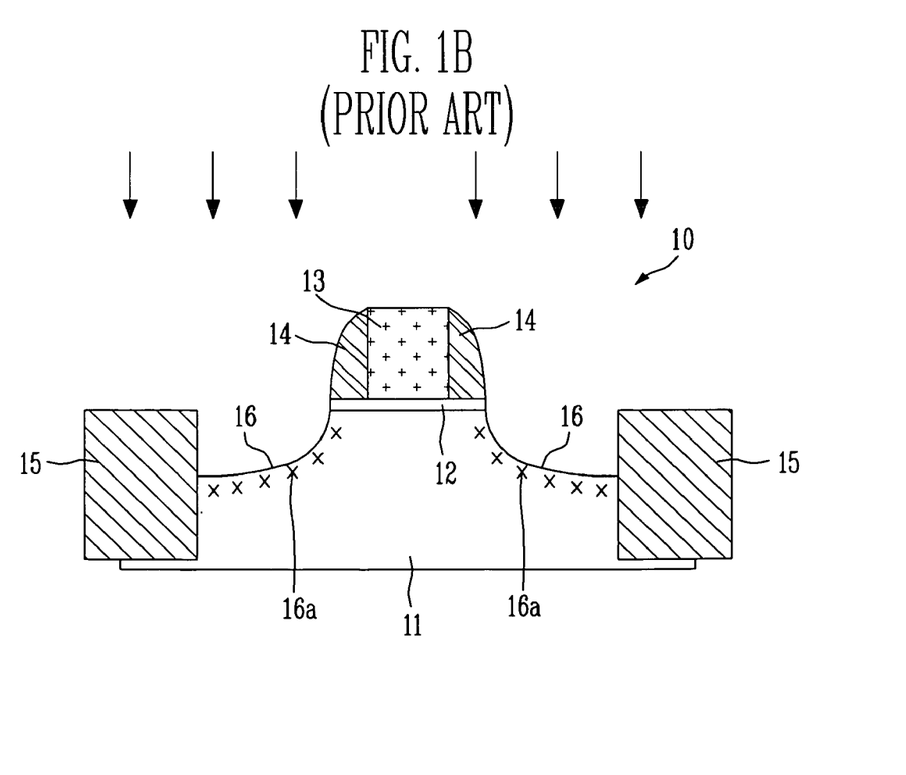

Referring to FIG. 1B, source and drain regions 16 are formed on the semiconductor substrate 11 of FIG. 1A using a plasma dry-etching method. The source and drain regions 16 are etched to a predetermined depth. In general, when the plasma dry-etching method is used, defects may occur on a silicon surface, and thus there are defects 16a on the surface of the source and drain regions 16 due to the etching.

Figure 1C:
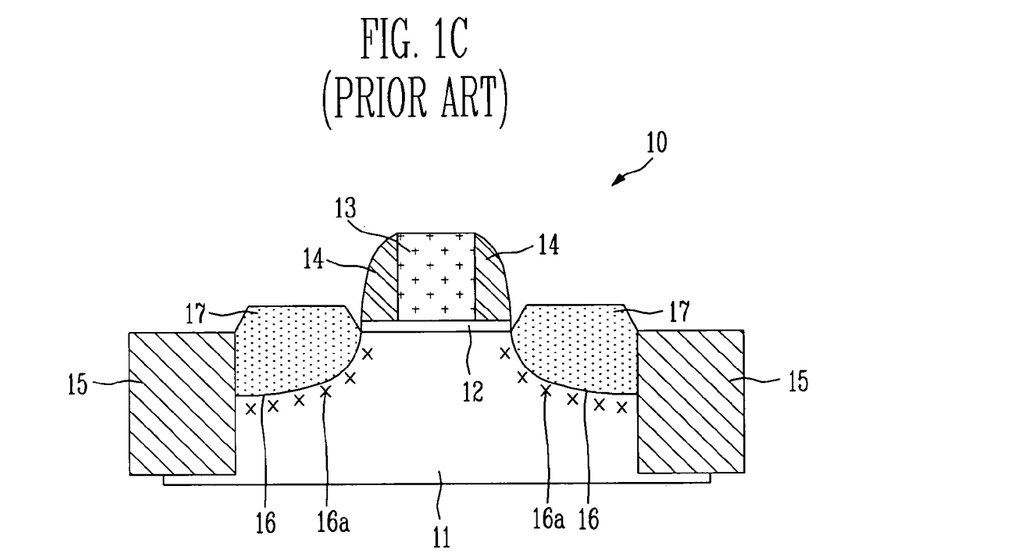
Figure 1D:
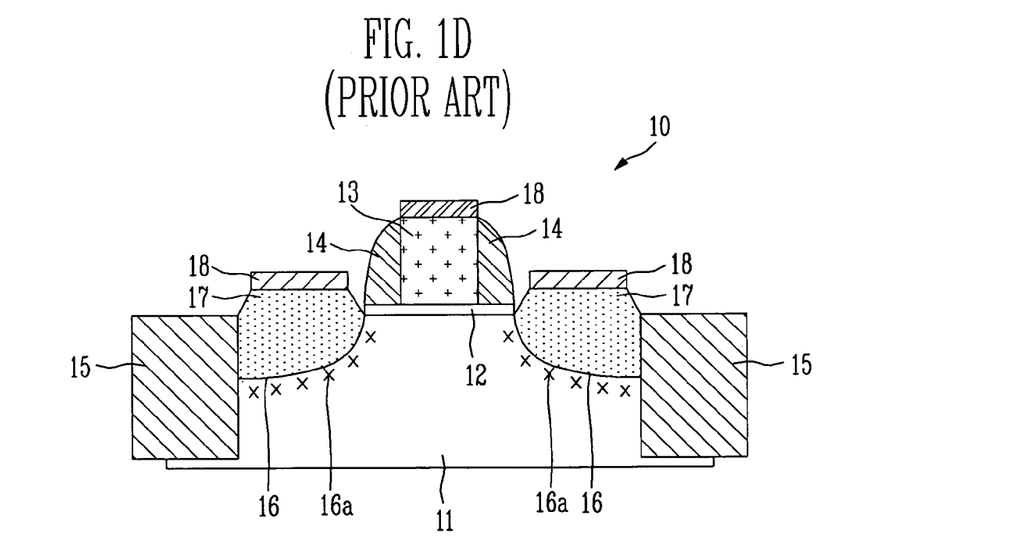

Referring to FIGS. 1C and 1D, after the plasma dry-etching process, SiGe single crystals are selectively grown so that source and drain electrodes 17 are formed on the source and drain regions 16. Subsequently, nickel-silicide layers 18 are formed on the SiGe single crystals and the gate electrode 13.

However, when the plasma dry-etching method is used to form the recessed SiGe source and drain regions through the process described above, defects may occur on the silicon surface and cause related defects on an interface on which the SiGe single crystals are formed. Therefore, in order to minimize the defects of the SiGe single crystals, low ion implantation energy is suggested together with a chemical dry-etching method. However, since the source and drain regions toward a silicon channel may be formed in a bird's beak shape rather than perpendicular to the surface of the silicon, stress cannot be uniformly transferred to the silicon channel.

In addition, according to the method described above, the source and drain regions are formed after the gate spacers are formed. Therefore, the distance between the source and drain becomes larger than the gate width by the distance of both spacers, so that it is hard to transfer stress to the silicon channel. More specifically, the source and drain regions are formed larger than the gate width, and thus a stress value in the silicon channel decreases compared to when the source and drain regions are positioned under both sides of the gate.

SUMMARY OF THE INVENTION

It is an object of the present invention to provide a semiconductor device in which source and drain regions are not etched and thus defective elements on a silicon interface are removed, and a recessed source and drain structure facilitates the transfer of stress to a silicon channel, and a method of manufacturing the semiconductor device.

One aspect of the present invention provides a method of manufacturing a semiconductor device, comprising the steps of: forming a first silicon layer on a semiconductor substrate; patterning the first silicon layer formed on the semiconductor substrate, and exposing a channel region; forming a second silicon layer on the semiconductor substrate in which the channel region is exposed; removing the first silicon layer, and forming source and drain regions; and forming a third silicon layer in the source and drain regions.

The method may further comprise the steps of: forming a silicon-oxide layer on the second silicon layer; and removing the silicon-oxide layer formed on the second silicon layer after forming the third silicon layer. The step of forming the second silicon layer in the channel region and the step of forming the third silicon layer in the source and drain regions may be performed under a deposition pressure of 10 to 50 torr. The semiconductor device manufacturing method may further comprise the step of cleaning the substrate before the step of forming the second silicon layer in the channel region and before the step of forming the third silicon layer. In the cleaning step, a diluted fluorine hydrogen (HF) solution may be used.

In the steps of forming the second silicon layer and the third silicon layer, a selective epitaxial growth method may be used. In the step of forming the second silicon layer, the second silicon layer may be selectively grown by a chemical vapor deposition method using a mixed gas of $SiH_2Cl_2/HCl/H_2$ or $SiH_4/HCl/H_2$. In the step of forming the second silicon layer, low-concentration impurities may be implanted into the second silicon layer in real time. In the step of forming the third silicon layer, the third silicon layer may be formed by the chemical vapor deposition method using a mixed gas of $SiH_4/GeH_4/HCl/H_2$. The semiconductor device manufacturing method may further comprise the step of performing a thermal process in a high-temperature hydrogen atmosphere at 950° C. or more in a chemical vapor deposition system before performing the step of forming the third silicon layer. In the step of forming the third silicon layer, the third silicon layer may be formed higher than the depth of the recessed source and drain regions. The third silicon layer may be formed of a SiGe layer.

A germanium concentration in the SiGe layer may be selected and adjusted in a range between 10% and 30%. In the step of forming the SiGe layer, high-concentration impurities may be implanted into the SiGe layer in real time. In the step of selectively removing the first silicon layer remaining in the source and drain regions, the first silicon layer may be selectively wet-etched by thermally oxidizing the silicon channel region. The first silicon layer may be formed of a silicon-nitride layer.

Another aspect of the present invention provides a semiconductor device comprising: a semiconductor substrate; a channel region grown as a single crystal on the semiconductor substrate; source and drain regions grown higher than the channel region by a predetermined height at both sides of the channel region on the semiconductor substrate; a gate insulating layer formed on the channel region; and a gate electrode formed on the gate insulating layer.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF EXEMPLARY EMBODIMENTS

Hereinafter, an exemplary embodiment of the present invention will be described in detail. However, the present invention is not limited to the embodiments disclosed below, but can be implemented in various types. Therefore, the present embodiment is provided for complete disclosure of the present invention and to fully inform the scope of the present invention to those ordinarily skilled in the art.

Figure 2:
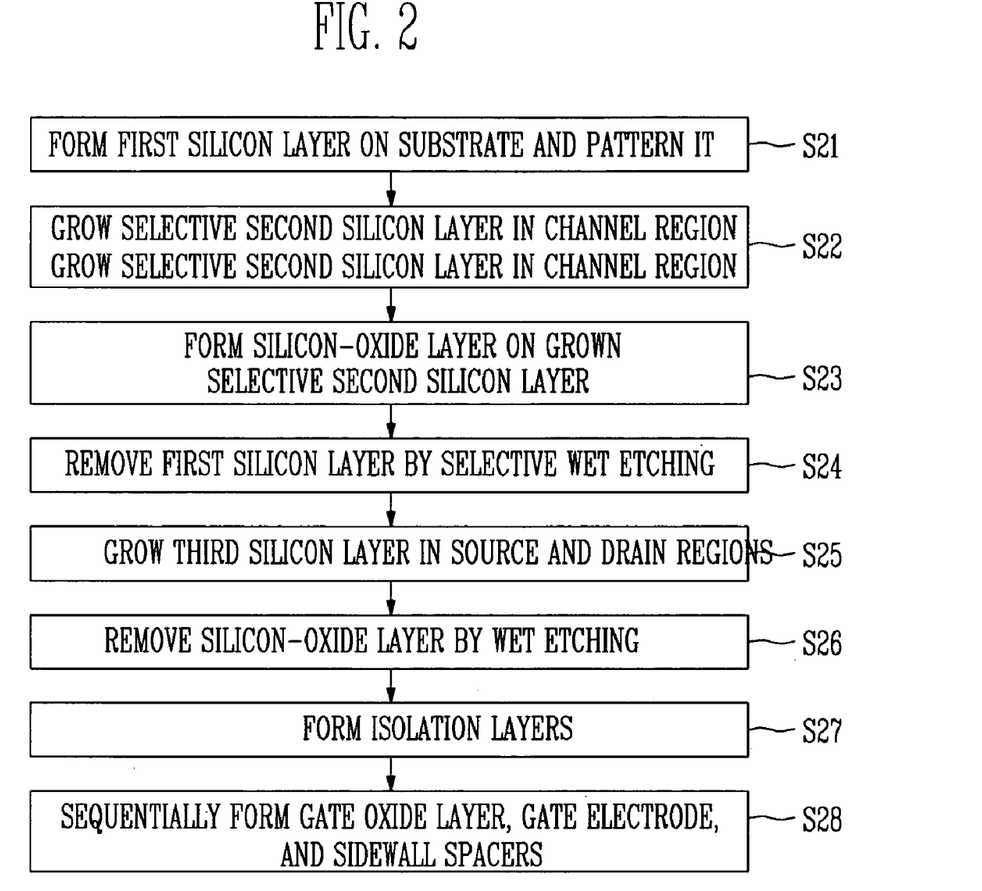
FIG. 2 is a flowchart showing a manufacturing process of a semiconductor device according to an exemplary embodiment of the present invention.

FIG. 2 is a flowchart showing a manufacturing process of a semiconductor device according to an exemplary embodiment of the present invention. FIGS. 3A to 3H are cross-sectional views illustrating a method of manufacturing a semiconductor device having a recessed silicon-germanium (SiGe) source and drain structure according to an exemplary embodiment of the present invention.

Figure 3A:
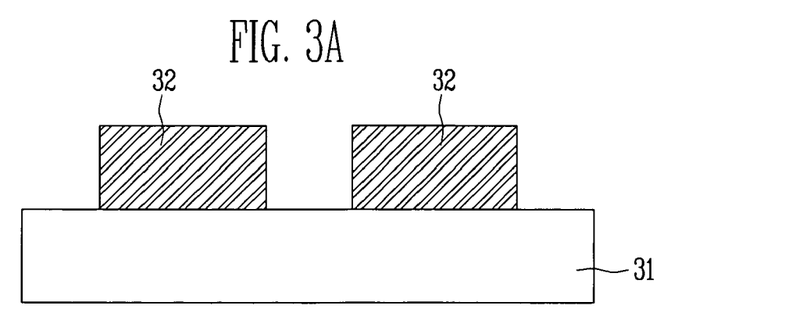
FIGS. 3A to 3H are cross-sectional views illustrating a method of manufacturing a semiconductor device having a recessed SiGe source and drain structure according to an exemplary embodiment of the present invention.

Referring to step S21 shown in FIG. 2, and to FIG. 3A, a semiconductor substrate 31 is first prepared, and a first silicon layer 32 is formed on the semiconductor substrate 31. In this embodiment, a silicon substrate made of single crystal silicon is used for the semiconductor substrate 31, and the first silicon layer 32 formed on the semiconductor substrate 31 is a silicon-nitride layer, i.e., a nitride silicon layer ($Si_3N_4$). The first silicon layer 32 is formed thicker than the depth of source and drain regions that will be formed in the following processes by about 50% to prevent performance deterioration of the semiconductor substrate 31 when the source and drain regions are recessed.

Subsequently, the first silicon layer 32 formed on the semiconductor substrate 31 is patterned. Here, the first silicon layer 32 is patterned except portions where the source and drain regions will be formed. While the first silicon layer 32 is patterned, both dry etching and wet etching are used. Preferably, the dry etching is performed first, and the dry etching and wet etching are performed at a ratio of 7:3. Since the dry etching is performed first, defective elements that will exert bad effects during selective silicon single-crystal growth to be performed later are removed.

Figure 3B:
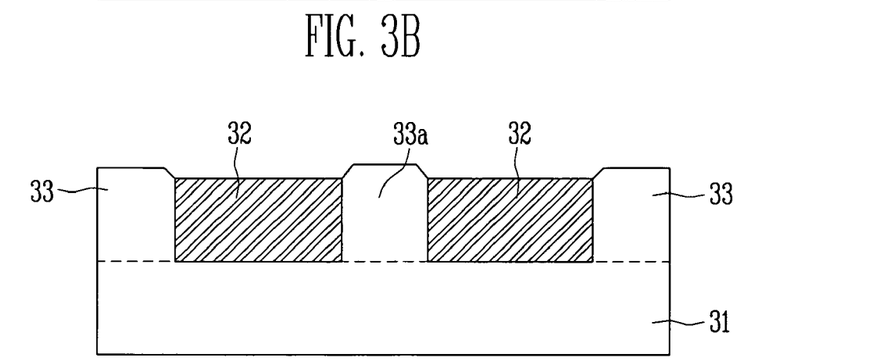

Referring to step S22 shown in FIG. 2, and to FIG. 3B, a region exposed between the patterned first silicon layers 32 formed on the semiconductor substrate 31 is a channel region, and a second silicon layer 33 is formed in the channel region (and other exposed regions on the semiconductor substrate 31). The second silicon layer 33 is an epitaxial layer selectively grown in the channel region. In this embodiment, the second silicon layer 33 is formed by a typical chemical vapor deposition (CVD) method. According to the CVD method that selectively forms the second silicon layer 33, $SiH_2Cl_2$ or $SiH_4$ gas is used as a silicon source gas, and HCl gas is used during deposition in order to increase an etching selectivity with respect to the first silicon layer 32. Therefore, a mixed gas of the above-mentioned gases, e.g., $SiH_2Cl_2/HCl/H_2$ or $SiH_4/HCl/H_2$, is used, $H_2$ being a reducing gas. When a CVD process is used to grow the selective second silicon layer 33, it is performed at a temperature of 1,000° C. to 1,200° C. And, while the selective second silicon layer 33 is deposited, low-concentration impurities are doped in real time to form a channel region 33A.

Figure 3C:
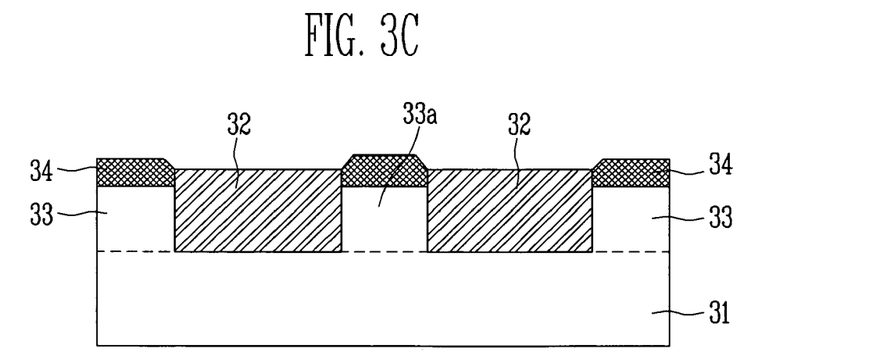

Referring to step S23 shown in FIG. 2, and to FIG. 3C, a silicon-oxide layer 34 is formed on the selective second silicon layer 33. In general, when a silicon layer is exposed to air, an oxide layer is formed immediately. However, in order to form an oxide layer having a larger thickness than a predetermined thickness, a CVD method and a thermal oxidation method are used. The silicon-oxide layer 34 described in this embodiment is formed to increase an etching selectivity when the first silicon layer 32 is selectively wet-etched in the following process, and formed by the thermal oxidation method. The thickness of the silicon-oxide layer 34 formed by the thermal oxidation method is a main factor in determining the depth of the source and drain regions, and is formed considering that the silicon-oxide layer 34 should maintain an enough thickness when the silicon-nitride layer 32 that is the first silicon layer is selectively etched.

Figure 3D:
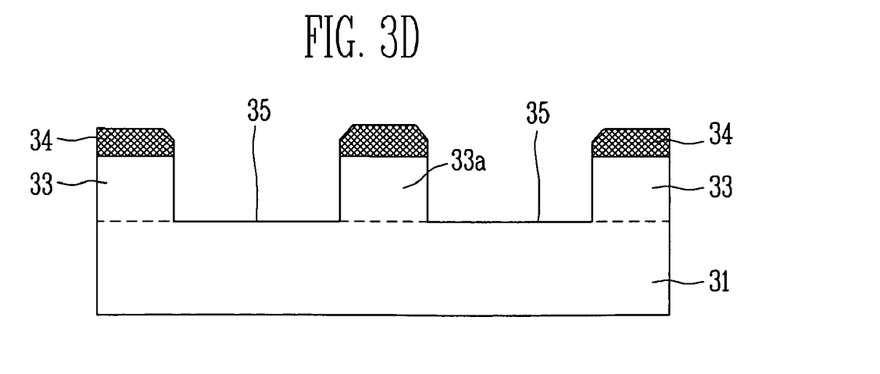

Referring to step S24 shown in FIG. 2, and to FIG. 3D, the first silicon layer 32 formed on the semiconductor substrate 31 is selectively removed. Here, the first silicon layer 32 is removed by wet etching, and source and drain regions 35 are exposed by removing the first silicon layer 32. In this embodiment, a wet-etching selectivity of the second silicon layer 33 and the first silicon layer 32 is maintained by only the wet etching without necessity to perform plasma dry etching used to form conventional source and drain regions. Therefore, a factor causing defects on a silicon substrate surface of the source and drain regions 35 can be completely removed. In addition, since the formed source and drain regions 35 are perpendicular to the semiconductor substrate 31, it is possible to uniformly transfer compressive stress to the silicon channel. Also, since the source and drain regions 35 are determined according to the position where the first silicon layers 32 are formed, it is possible to keep a distance between a source and a drain by a gate width, so that high stress can be concentrated to the silicon channel.

Figure 3E:
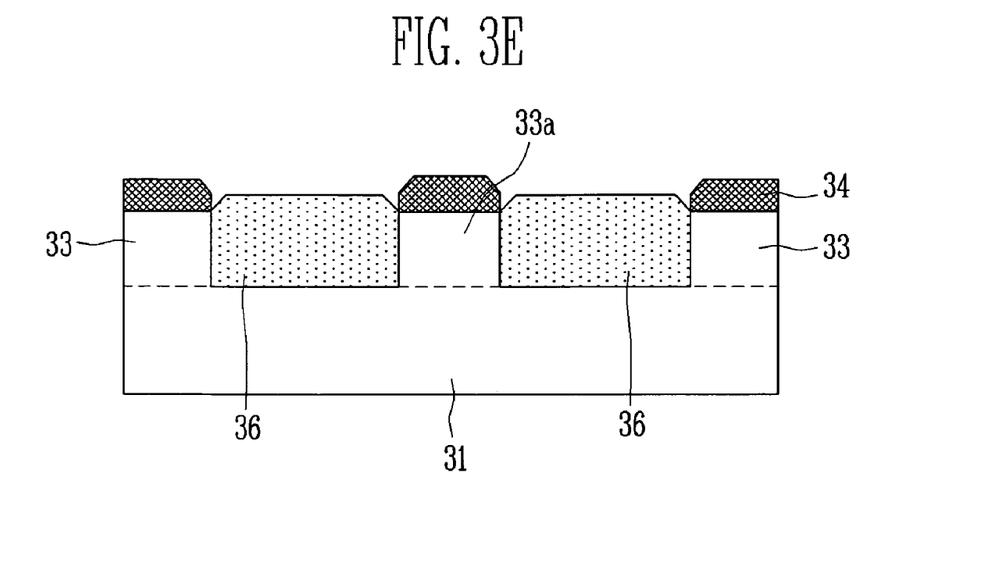

Referring to step S25 shown in FIG. 2, and to FIG. 3E, third silicon layers 36 are selectively grown in the source and drain regions exposed through step S24. In this embodiment, the third silicon layers are SiGe layers 36. Here, the SiGe layers 36 are formed by a typical CVD process. In the CVD process that forms the selective SiGe layers 36, $SiH_4$ gas is used as a silicon source gas, $GeH_4$ gas is used as a germanium source gas, and HCl gas is used to increase an etching selectivity with respect to the silicon-oxide layer 34. It is preferable to use a mixed gas of the above-mentioned gases.

The quality of a single crystal depends on the quality of a lower layer. Therefore, before the SiGe layers 36 are grown, the source and drain regions 35 are cleaned using a diluted fluorine hydrogen solution and then baked in a hydrogen atmosphere at 950° C. or more in a CVD system, so that a native oxide layer formed on the surface of the silicon substrate is completely removed. When the selective SiGe layers 36 are deposited after the cleaning and baking processes, a ratio of $SiH_4/GeH_4$ is adjusted to change a germanium concentration.

By changing the germanium concentration, the compressive stress applied to the silicon channel region 33a is adjusted. Here, the germanium concentration is adjusted in a range between 10% and 30% considering a critical thickness of SiGe growth. In addition, in order to adjust a contact resistance, high-concentration impurities are doped into the SiGe layers 36 in real time. The SiGe layers 36 grown in the recessed source and drain regions 35 can be formed higher than the depth of the recessed source and drain regions 35. Here, in order to prevent the impurities implanted in real time from laterally diffusing, it is preferable to perform a CVD process at a temperature of 700° C. or less.

Figure 3F:
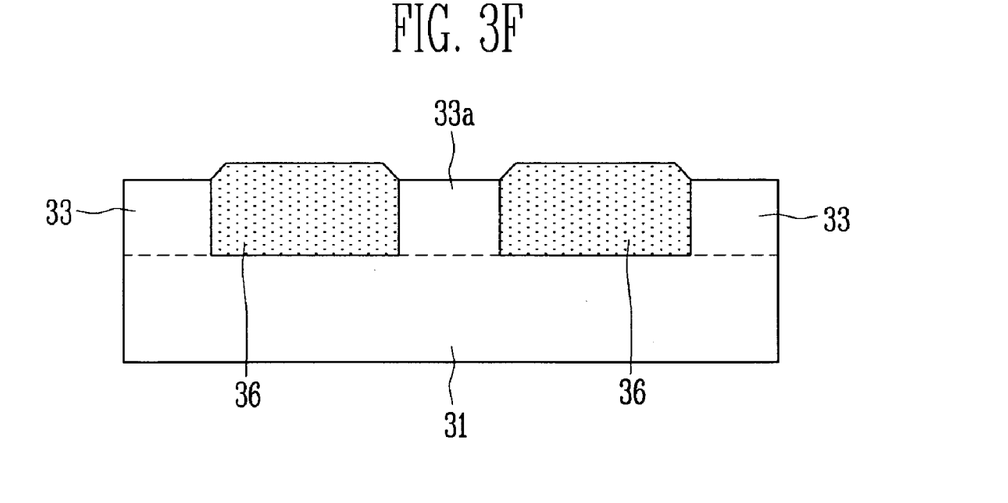

Referring to step S26 shown in FIG. 2, and to FIG. 3F, after the SiGe layers 36 are formed in the source and drain regions 35, the silicon-oxide layer 34 remaining on the semiconductor substrate 31 is completely removed by a wet-etching process.

Figure 3G:
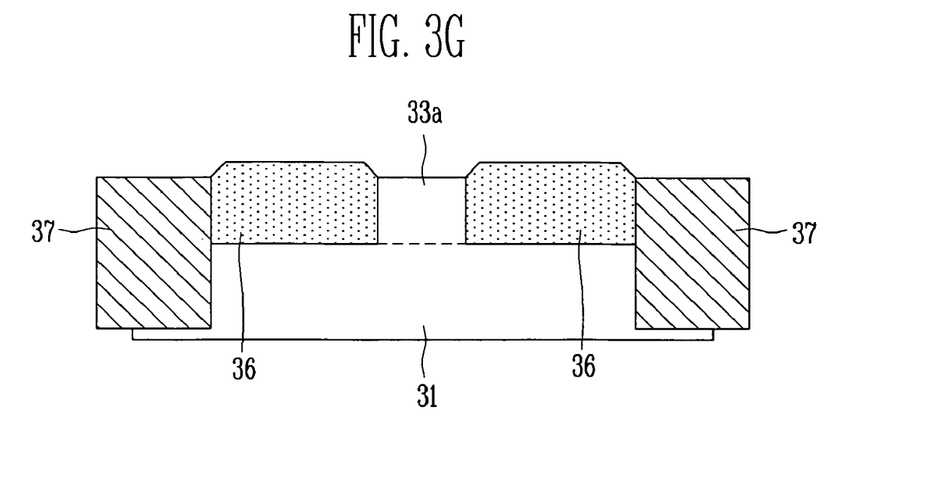

Referring to step S27 shown in FIG. 2, and to FIG. 3G, isolation layers 37 are formed at both sides of the SiGe layers 36 by a typical method of fabricating a metal-oxide semiconductor field effect transistor (MOSFET). Referring to step S28 shown in FIG. 2, and to FIG. 3H, a gate insulating layer 38 is formed on the channel region 33a. In this embodiment, the gate insulating layer 38 is formed on predetermined regions of the channel region 33a and the SiGe layers 36.

Figure 3H:
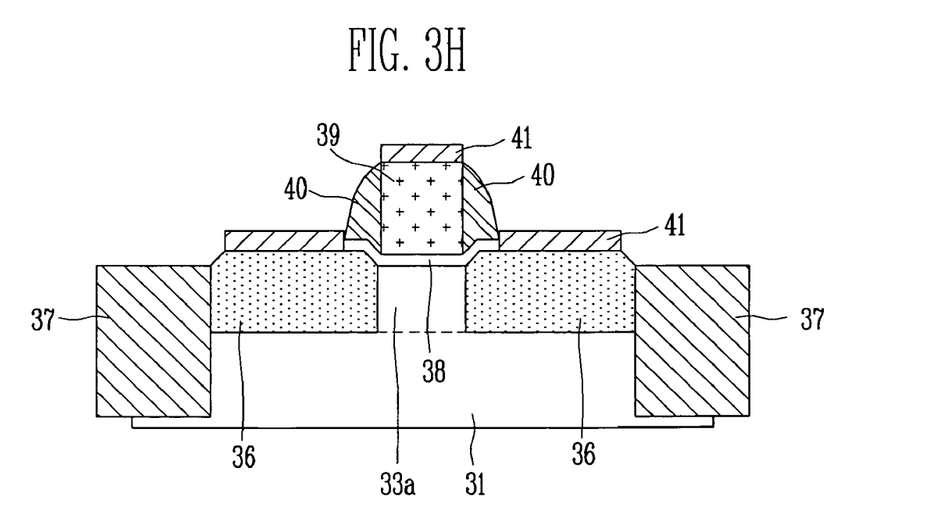

Subsequently, a gate electrode 39 is formed on the gate insulating layer 38. The gate electrode 39 is formed not to be wider than the channel region 33a. Sidewall spacers 40 are formed on sidewalls of the gate electrode 39. In this embodiment, the sidewall spacers 40 are formed on the sidewalls of the gate electrode 39, but also can be formed on sidewalls of the gate oxide layer 38 according to the form of the gate oxide layer 38. Subsequently, a source junction and a drain junction are formed at both sides of the channel region 33a under the gate electrode 39 to be spaced apart from each other in the semiconductor substrate 31. And then, a silicide layer 41 is formed on exposed regions of the source and drain 36 and the gate electrode 39. Through the sequential processes described above, the semiconductor device having the recessed SiGe source and drain structure is fabricated.

In the embodiment described above, the SiGe layers 36 are formed, and then the isolation layers 37 are formed. However, it is possible to form the isolation layer after all steps S21 to S28 are performed or after only a part of the steps is performed.

According to the present invention, it is possible to form a recessed SiGe source and drain structure that defects in a silicon interface are completely removed using only a selective epitaxial growth method without a dry-etching process. Also, since a distance between source and drain regions and a channel region can be adjusted according to intention of a user, large stress can be concentrated to a silicon channel region. In addition, since recessed SiGe source and drain regions are formed by the above-described process, hole mobility considerably increases, so that it is possible to improve driving current characteristics of a semiconductor device.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A method of manufacturing a semiconductor device, comprising the steps of:
    forming a first silicon layer on a semiconductor substrate;
    patterning the first silicon layer formed on the semiconductor substrate, and exposing a channel region;
    forming a second silicon layer on the semiconductor substrate in which the channel region is exposed;
    removing the first silicon layer, and forming source and drain regions; and
    forming a third silicon layer in the source and drain regions.

2. The method of claim 1, further comprising the steps of:
    forming a silicon-oxide layer on the second silicon layer; and
    removing the silicon-oxide layer formed on the second silicon layer after forming the third silicon layer.

3. The method of claim 2, further comprising the step of cleaning the substrate before forming the second silicon layer on the channel region and before forming the third silicon layer.

4. The method of claim 1, wherein the steps of forming the second silicon layer and the third silicon layer are performed by a selective single-crystal growth method.

5. The method of claim 4, wherein the steps of forming the second silicon layer and the third silicon layer are performed by a chemical vapor deposition method.

6. The method of claim 5, wherein the step of forming the second silicon layer includes the step of implanting low-concentration impurities into the second silicon layer in real time.

7. The method of claim 5, further comprising the step of performing an annealing process in a hydrogen atmosphere at 950° C. or more in a chemical vapor deposition system before forming the third silicon layer.

8. The method of claim 7, wherein the third silicon layer is formed higher than a depth of the source and drain regions.

9. The method of claim 8, wherein the third silicon layer is formed of a silicon-germanium layer.

10. The method of claim 9, wherein the silicon-germanium layer has a germanium concentration selected and adjusted in a range between 10% and 30%.

11. The method of claim 10, wherein the step of forming the silicon-germanium layer includes the step of implanting high-concentration impurities into the silicon-germanium layer in real time.

12. The method of claim 1, wherein the step of removing the first silicon layer includes the step of selectively wet-etching the first silicon layer.

* * * * *